United States Patent
Seo et al.

(10) Patent No.: US 8,071,974 B2
(45) Date of Patent: Dec. 6, 2011

(54) ORGANIC THIN FILM TRANSISTOR INCLUDING ORGANIC INSULATING LAYER AND SUBSTRATE INCLUDING THE SAME

(75) Inventors: Hyun-Sik Seo, Annyang-si (KR); Nack-Bong Choi, Jangan-gu (KR)

(73) Assignee: LG Display Co. Ltd., Seoul (KR)

( * ) Notice: Subject to any disclaimer, the term of this patent is extended or adjusted under 35 U.S.C. 154(b) by 0 days.

(21) Appl. No.: 11/153,292

(22) Filed: Jun. 15, 2005

(65) Prior Publication Data
US 2006/0054885 A1   Mar. 16, 2006

(30) Foreign Application Priority Data
Sep. 15, 2004   (KR) .................. 10-2004-0073815

(51) Int. Cl.
*H01L 35/24* (2006.01)
*H01L 51/00* (2006.01)

(52) U.S. Cl. .............. 257/40; 257/E51.002; 525/329.7; 525/330.3

(58) Field of Classification Search ............ 257/40, 257/E51.002; 525/329.7, 330.3
See application file for complete search history.

(56) References Cited

U.S. PATENT DOCUMENTS

| | | | |
|---|---|---|---|
| 6,246,070 B1 * | 6/2001 | Yamazaki et al. | 257/40 |
| 6,621,099 B2 * | 9/2003 | Ong et al. | 257/40 |
| 6,706,403 B1 * | 3/2004 | Olofson et al. | 428/413 |
| 6,723,394 B1 * | 4/2004 | Sirringhaus et al. | 428/1.1 |
| 6,770,904 B2 * | 8/2004 | Ong et al. | 257/40 |
| 6,774,393 B2 * | 8/2004 | Murti et al. | 257/40 |
| 6,828,582 B1 * | 12/2004 | Ando et al. | 257/40 |
| 7,015,502 B2 * | 3/2006 | Arai et al. | 257/40 |
| 2002/0046880 A1 * | 4/2002 | Takubo et al. | 174/261 |
| 2003/0127643 A1 * | 7/2003 | Park | 257/40 |

FOREIGN PATENT DOCUMENTS

| | | |
|---|---|---|
| JP | 2002-110999 | 4/2002 |
| JP | 2002-198539 | 7/2002 |
| JP | 2003-098548 | 4/2003 |
| JP | 2003-158134 | 5/2003 |
| JP | 2004-128469 | 4/2004 |

OTHER PUBLICATIONS

Office Action dated Aug. 31, 2006 for corresponding Korean Patent Application No. 10-2004-0073815.
Office Action issued in corresponding Chinese Patent Application No. 200510077424.9; issued Jul. 4, 2008.
Office Action issued in corresponding Japanese Patent Application No. 2005-186968; issued Jun. 2, 2009.
Office Action issued in corresponding Japanese Patent Application No. 2005-186968; issued Feb. 24, 2009.

* cited by examiner

*Primary Examiner* — Kenneth Parker
*Assistant Examiner* — Anthony Ho
(74) *Attorney, Agent, or Firm* — Brinks Hofer Gilson & Lione

(57) ABSTRACT

An organic thin film transistor includes a gate electrode having a first thickness on a substrate; an organic insulating layer on the gate electrode and the substrate, a portion of the organic insulating layer on the substrate having a second thickness, and a portion of the organic insulating layer on the gate electrode having a third thickness of about 2000 Å to 5000 Å; a semiconductor layer on the organic insulating layer; and source and drain electrodes on the organic insulating layer and contacting both side portions of the semiconductor layer.

16 Claims, 14 Drawing Sheets

ORGANIC THIN FILM TRANSISTOR INCLUDING ORGANIC INSULATING LAYER AND SUBSTRATE INCLUDING THE SAME

The present invention claims the benefit of Korean Patent Application No. 2004-0073815, filed in Korea on Sep. 15, 2004, which is hereby incorporated by reference.

FIELD OF THE INVENTION

The present invention relates to an organic thin film transistor, and more particularly, to an organic thin film transistor (TFT) using an organic insulating layer and a substrate including the same.

DISCUSSION OF THE RELATED ART

Until recently, display devices have typically used cathode-ray tubes (CRTs). Presently, much effort is being expended to study and develop various types of flat panel displays, such as liquid crystal display (LCD) devices, plasma display panels (PDPs), field emission displays (FED), and electro-luminescence displays (ELDs), as a substitute for CRTs. In particular, these types of flat panel displays have been driven in an active matrix type display in which a plurality of pixels arranged in a matrix form are driven using a pluarality of thin film transistors therein. Among the active matrix types of flat panel displays, liquid crystal display (LCD) devices and electroluminescent display (ELD) devices are widely used as monitors for notebook computers and desktop computers because of their high resolution, ability to display colors and superiority in displaying moving images.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into the direction of the induced electric field, thereby changing the light transmissivity of the LCD device. Thus, the LCD device displays images by varying the intensity of the induced electric field.

FIG. 1 is a perspective view of an LCD device according to the related art. As shown in FIG. 1, the LCD device includes a lower substrate 10, an upper substrate 20 and a liquid crystal material 30. A lower substrate 10 is referred to as an array substrate that includes a gate line 14 and a data line 16 on a first substrate 12 that cross each other to define a pixel region "P". A pixel electrode 18 and a thin film transistor "T", as a switching element, are positioned in each pixel region. Thin film transistors "T", which are disposed adjacent to where the gate lines 14 and the data lines 16 cross, are disposed in a matrix form on the first substrate 12. The upper substrate 20 is referred to as a color filter substrate that includes color filter patterns 26 including red (R), green (G) and blue (B) color filter patterns 26a, 26b and 26c on a second substrate 22, a black matrix 25 between the color filter patterns 26, and a common electrode 28 on both the color filter pattern 26 and the black matrix 25.

In the above related art LCD device, a hard type substrate such as a glass substrate has been used as each of the first and second substrates. In accordance that small-size portable display devices such as personal digital assistants (PDA) and notebook computers are used widely presently, much effort is being expended to study and develop a flexible substrate such as a plastic substrate having a low weight and flexibility. However, since processes of fabricating the substrate including the thin film transistor are conducted mainly at a high temperature of more than 200 degrees centigrade, it is difficult to use the flexible substrate as the substrate including the thin film transistor, instead of the glass substrate. Accordingly, the flexible substrate is used for the color filter substrate, and the hard type substrate is used for the array substrate.

Effort is also being expended to study and develop a method for fabricating the flexible substrate at a low temperature less than 200 degrees centigrade by using an organic thin film transistor.

FIG. 2 is a cross-sectional view of an array substrate for an LCD device including an organic thin film transistor according to the related art.

As shown in FIG. 2, an organic thin film transistor "T" and a pixel electrode 85 are disposed on a flexible substrate 51. The thin film transistor "T" includes a gate electrode 54, a gate insulating layer 60, a semiconductor layer 65 and source and drain electrodes 72 and 74. The organic thin film transistor "T" is connected to the pixel electrode 85 through a contact hole 80 in a passivation layer 77.

The semiconductor layer 65 is made of an organic low molecule or high molecule semiconductive material, instead of silicon. Since the semiconductor layer 65 is formed at a temperature less than 200 degrees centigrade, when silicon is used, the semiconductor layer 65 does not have a dense structure. Accordingly, electric characteristics, such as mobility, of the semiconductor layer 65 are degraded. To solve this problem, the organic semiconductive material is used for the semiconductor layer 65.

The gate electrode 54 is made of a metal having a low melting point and has a first thickness "t1" of about 2000 Å to 4000 Å.

The gate insulating layer 60 is made of an organic insulating material and has a second thickness "t2" more than 9000 Å. The gate insulating layer 60 of the organic insulating material is formed by a coating method. Since the organic insulating material has a high viscosity, the gate insulating layer 60 of the organic insulating material has a thickness more than the gate insulating layer of an inorganic insulating material having a thickness of about 3000 Å to 4000 Å.

The LCD device using the gate insulating layer 60 of the organic insulating material has a flexibility more than the LCD device using the gate insulating layer of the inorganic insulating material. Further, since the gate insulating layer 60 of the organic insulating material has a planarization characteristic, an upper surface of the gate insulating layer 60 is planar, and thus an upper surface of the semiconductor layer 65 is planar without steps. Accordingly, characteristics of the semiconductor layer 65 are improved. If the gate insulating layer is made of the inorganic insulating material having a low flexibility, the gate insulating layer of the inorganic insulating material is detached when warping the array substrate. Accordingly, the organic insulating material is used for the gate insulating layer 60.

However, as explained above, since the gate insulating layer 60 of the organic insulating material has the second thickness "t2" more than 9000 Å and the gate electrode 54 has the first thickness "t1" of 2000 Å to 3000 Å, the semiconductor layer 65 is far apart from the gate electrode 54 by a third thickness "t3" of the gate insulating layer on the gate electrode 54. Accordingly, electric characteristics, such as an on-current, of the semiconductor layer 65 are degraded, and a storage capacitance is degraded.

SUMMARY OF THE INVENTION

By way of introduction only, in one aspect an organic thin film transistor includes a gate electrode having a first thickness on a substrate; an organic insulating layer on the gate electrode and the substrate, a portion of the organic insulating layer on the substrate having a second thickness, and a portion of the organic insulating layer on the gate electrode having a third thickness of about 2000 Å to 5000 Å; a semiconductor layer on the organic insulating layer; and source and drain electrodes on the organic insulating layer and contacting both side portions of the semiconductor layer.

In another aspect, a method of fabricating an organic thin film transistor includes forming a gate electrode having a first thickness on a substrate; forming an organic insulating layer on the gate electrode and the substrate, a portion of the organic insulating layer on the substrate having a second thickness, and a portion of the organic insulating layer on the gate electrode having a third thickness of about 2000 Å to 5000 Å; and forming a semiconductor layer and source and drain electrodes on the organic insulating layer, the source and drain electrodes contacting both side portions of the semiconductor layer.

In another aspect, a substrate for a liquid crystal display device including an organic thin film transistor includes a gate electrode having a first thickness on a substrate; an organic insulating layer on the gate electrode and the substrate, a portion of the organic insulating layer on the substrate having a second thickness, and a portion of the organic insulating layer on the gate electrode having a third thickness of about 2000 Å to 5000 Å; a semiconductor layer on the organic insulating layer; source and drain electrodes on the organic insulating layer and contacting both side portions of the semiconductor layer; a passivation layer on the source and drain electrodes, the passivation layer having a contact hole exposing the drain electrode; and a pixel electrode on the passivation layer and contacting the drain electrode through the contact hole.

In another aspect, a method of fabricating a substrate for a liquid crystal display device including an organic thin film transistor includes forming a gate electrode having a first thickness on a substrate; forming an organic insulating layer on the gate electrode and the substrate, a portion of the organic insulating layer on the substrate having a second thickness, and a portion of the organic insulating layer on the gate electrode having a third thickness of about 2000 Å to 5000 Å; forming a semiconductor layer and source and drain electrodes on the organic insulating layer, the source and drain electrodes contacting both side portions of the semiconductor layer; forming a passivation layer on the source and drain electrodes, the passivation layer having a contact hole exposing the drain electrode; and forming a pixel electrode on the passivation layer and contacting the drain electrode through the contact hole.

In another aspect, an organic thin film transistor includes a gate electrode having a first thickness on a substrate; an organic insulating layer on the gate electrode and the substrate, a portion of the organic insulating layer on the substrate having a second thickness, and a portion of the organic insulating layer on the gate electrode having a third thickness, a ratio of the first to third thicknesses being greater than about 1; a semiconductor layer on the organic insulating layer; and source and drain electrodes on the organic insulating layer and contacting both side portions of the semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the illustrated embodiments of the present invention, which are illustrated in the accompanying drawings.

Figure 1:
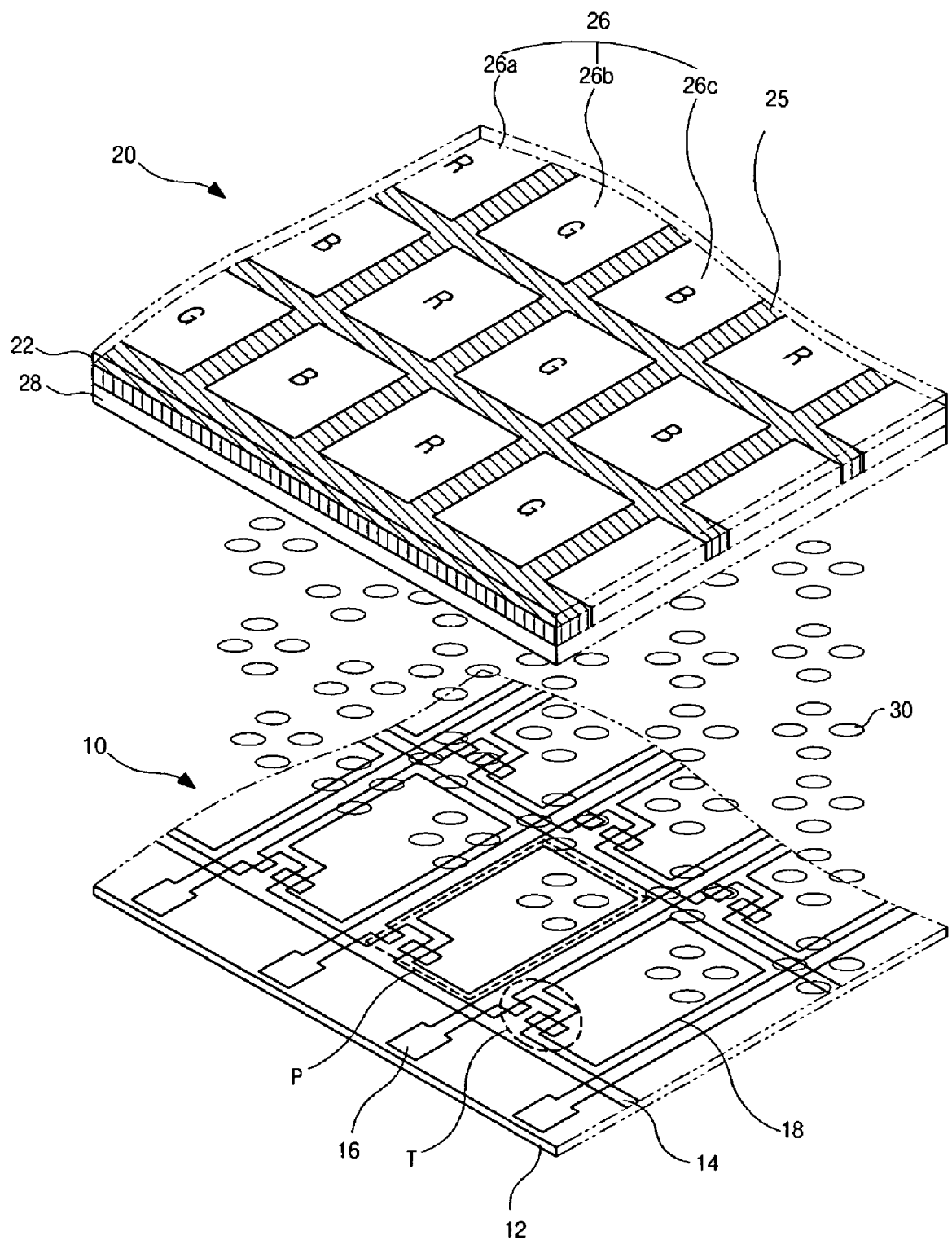
FIG. 1 is a perspective view of an LCD device according to the related art.
Figure 2:
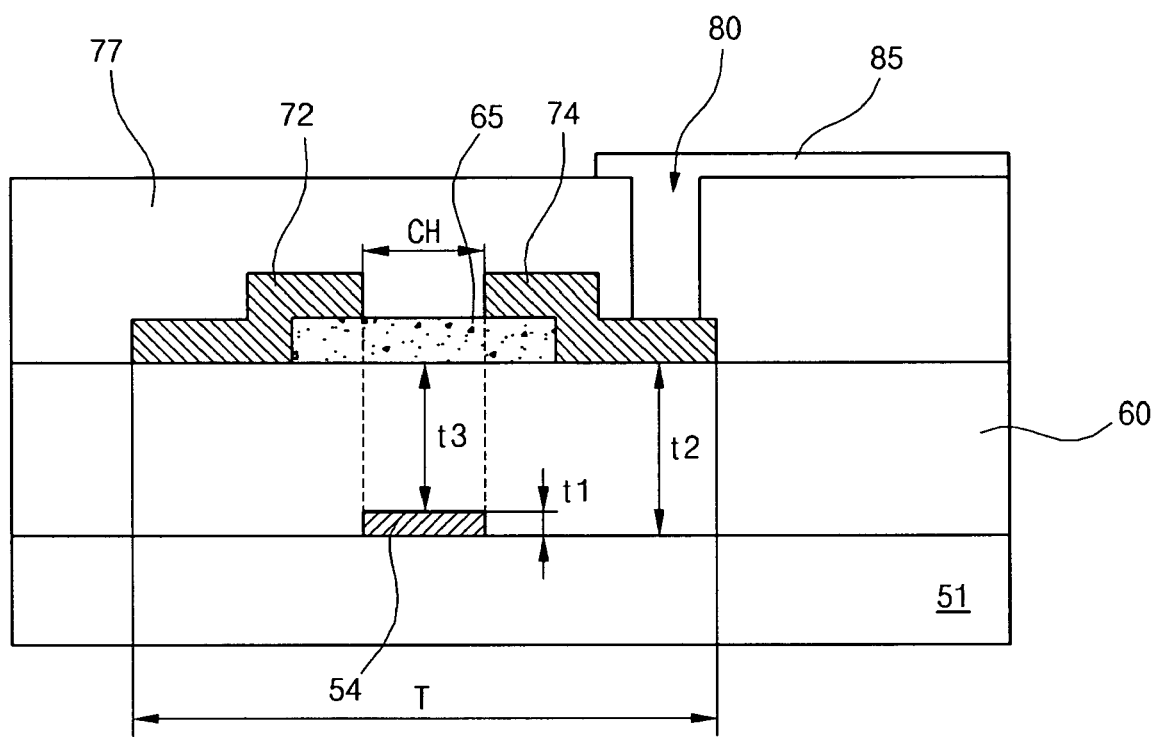
FIG. 2 is a cross-sectional view of an array substrate for an LCD device including an organic thin film transistor according to the related art.
Figure 3:
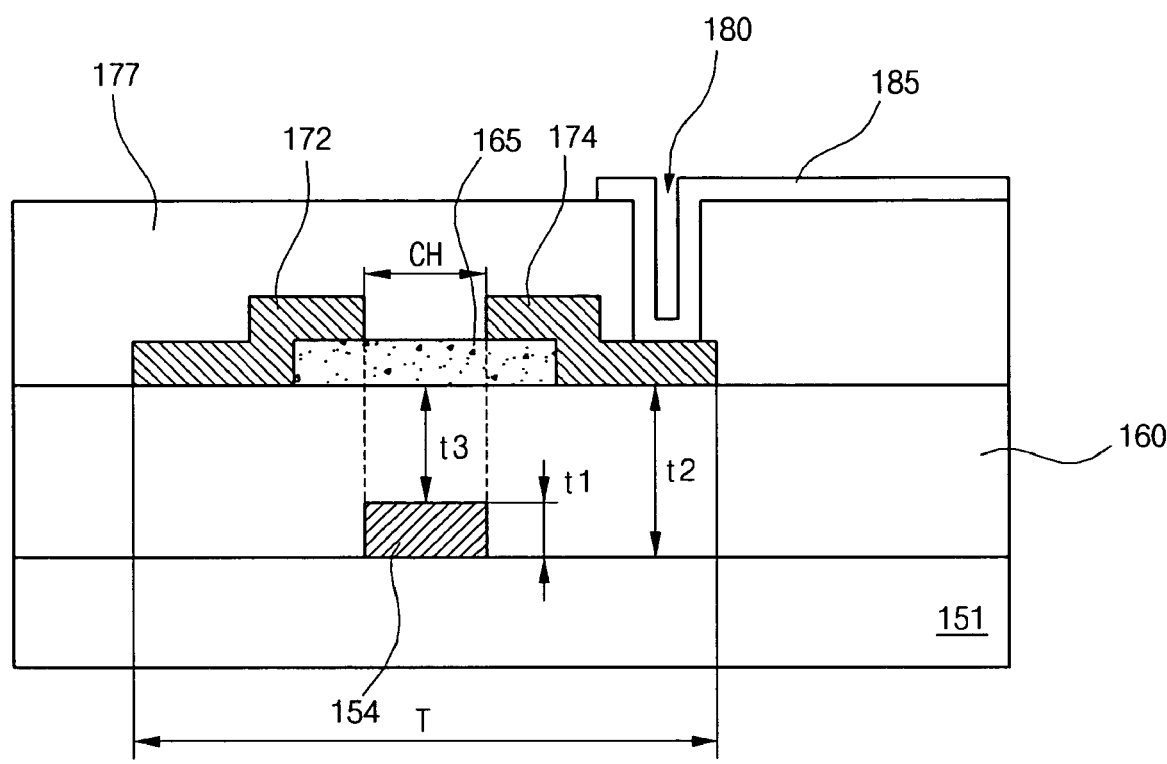
FIG. 3 is a plan view of an array substrate for an LCD device including an organic thin film transistor according to a first exemplary embodiment of the present invention.

FIG. 3 is a plan view of an array substrate for an LCD device including an organic thin film transistor according to a first exemplary embodiment of the present invention.

As shown in FIG. 3, an organic thin film transistor "T" and a pixel electrode 185 are disposed on a flexible substrate 151. The organic thin film transistor "T" includes a gate electrode 154 on the flexible substrate 151, an gate insulating layer 160 on the gate electrode 154 and the flexible substrate 151, a semiconductor layer 165 on the gate insulating layer 160, and source and drain electrodes 172 and 174 on the semiconductor layer 165 and the gate insulating layer 160. A passivation layer 177 is disposed on the organic thin film transistor "T" and has a contact hole 180 exposing the drain electrode 174. The pixel electrode 185 contacts the drain electrode 174 through the contact hole 180. Though not shown in the drawings, the gate electrode 154 and the source electrode 172 are respectively connected to gate and data lines which cross each other to define a pixel region. The thin film transistor "T" is disposed adjacent to crossing portions of the gate and the data line, and the pixel electrode 185 is disposed in the pixel region.

An upper surface of the gate insulating layer 160 is planar, and thus an upper surface of the semiconductor layer 165 is planar. The source and drain electrodes 172 and 174 overlap and contact both side portions of the semiconductor layer 165. A channel "CH" of the semiconductor layer 165 corresponds to the gate electrode 154 and a space between the source and drain electrodes 172 and 174.

The flexible substrate 151 may be made of plastic. The semiconductor layer 154 may be made of organic low molecule or high molecule semiconductive material. The gate insulating layer 160 may be made of at least one of benzo-cyclo-butene (BCB), photo acrylic and poly vinyl phenol (PVP).

The gate electrode 154 has a first thickness "t1" about equal to or more than 5000 Å. A first portion of the gate insulating layer 160 on the flexible substrate 151 has a second thickness "t2" about equal to or more than 9000 Å. A second portion of the gate insulating layer 160 on the gate electrode 154 has a third thickness "t3" of about 2000 Å to 5000 Å. The third thickness "t3" is a distance between the gate electrode 154 and the semiconductor 165. The third thickness "t3" is determined by difference of the first and second thicknesses "t1" and "t2". In other words, the first, second and third thicknesses "t1", "t2" and "t3" are related to one another. Accordingly, when the two of the first, second and third thicknesses "t1", "t2" and "t3" are determined, another is obtained. Since the first thickness "t1" of the gate electrode 154 is greater than the first thickness, of about 2000 Å to 4000 Å, of the related art gate electrode, the third thickness "t3" is smaller than the related art third thickness.

Hereinafter, an on-current characteristic of the organic thin film transistor "T" according to the third thickness "t3" will be explained in detail.

A drain current "$I_{ds}$" (or an on-current) of the organic thin film transistor "T" is expressed by a first expression, $I_{ds}=\mu(WC/2L)dV_g^2$ (where "$\mu$" is a mobility, "W" is a width of the channel "CH", "C" is a capacitance between the gate electrode 154 and the channel "CH", "L" is a length of the channel "CH", "$V_g$" is a gate voltage, "$dV_g^2$" is a variable quantity of the gate voltage "$V_g$", and "C" is referred to as a channel capacitance). With reference to the first expression, the drain current "$I_{ds}$" is proportional to the channel capacitance "C" if other variables of the first expression are constant.

The channel capacitance "C" is expressed by a second expression, $C=\in(A/d)$ (where "$\in$" is a dielectric constant of the gate insulating layer 160, "A" is an area of the channel "CH", and "d" is a thickness of the gate insulating layer 160 on the gate electrode 154 i.e., the third thickness "t3"). With reference to the second expression, the channel capacitance "C" is greater as the dielectric constant "$\in$" is greater and the thickness "d" (i.e., the third thickness "t3") is smaller.

Therefore, with reference to the first and second expressions, the channel capacitance "C" increases in order to increase the drain current "$I_{ds}$" if other variables of the first expression are constant, and the third thickness "t3" decreases in order to increase the channel capacitance "C".

As a resolution of the LCD device is greater, an on time (i.e., scanning time) of the organic thin film transistor is smaller. Accordingly, to supply a sufficient voltage to the gate electrode 154 of the organic thin film transistor "T" during the on time, the drain current "$I_{ds}$" is increased. Due to these reasons, it is required to decrease the third thickness "t3". Further, though not shown in the drawings, as the thickness "t3" is smaller, a storage capacitance is greater.

One example for obtaining the thickness "t3" with reference to the second expression will be explained. Supposed that the gate insulating layer is made of an inorganic insulating material such as silicon nitride (SiNx) having a dielectric constant of about 6.7 and a thickness of about 4000 Å. When an organic insulating material, such as benzo-cyclo-butene (BCB), photo acrylic and poly vinyl phenol (PVP) having a dielectric constant of about 2.6 to 4, is used instead of the inorganic insulating material, the third thickness "t3" is about 1500 Å to 3000 Å by using the second expression. As such, when the channel capacitance "C" increases, the drain current "$I_{ds}$" increases. However, a delay of a gate voltage "$V_g$" on the gate line (not shown) connected to the gate electrode "154" occurs. Accordingly, to regulate adequately the drain current "$I_{ds}$" and the delay of the gate voltage, it may be preferable that the third thickness "t3" is about 2000 Å to 5000 Å, as explained above.

FIGS. 4 to 10 are cross-sectional views showing processes of fabricating an array substrate for an LCD device including an organic thin film transistor according to the first exemplary embodiment of the present invention. Though not shown in FIGS. 4 to 10, a flexible substrate 151 is placed on a rigid substrate. In other words, due to a flexibility of the flexible substrate 151, warping of the flexible substrate 151 may occur when transferring the flexible substrate 151 to conduct processing. Accordingly, to prevent warping of the flexible substrate 151, the rigid substrate therebelow is used.

Figure 4:
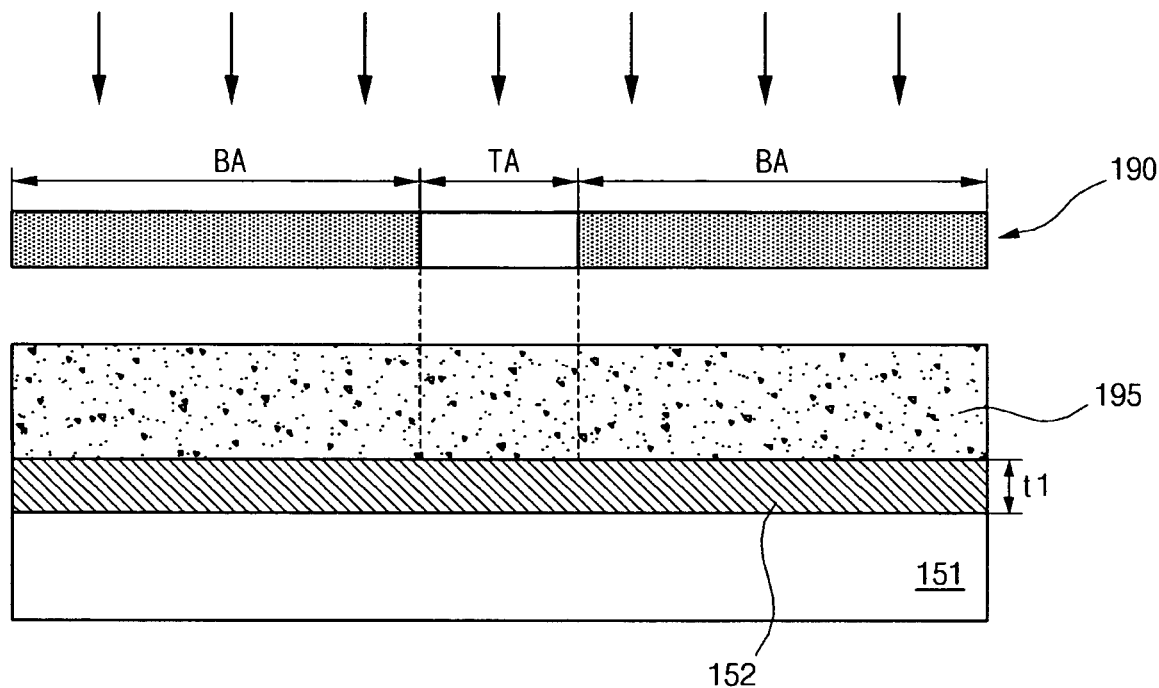
FIGS. 4 to 10 are cross-sectional views showing processes of fabricating an array substrate for an LCD device including an organic thin film transistor according to the first exemplary embodiment of the present invention.

As shown in FIG. 4, a first metal layer 152 is formed on a flexible substrate 151. The first metal 152 may be at least one of gold (Au), silver (Ag), copper (Cu) and molybdenum (Mo) having a low melting point. The first metal is deposited at a temperature about equal to or less than 200 degrees centigrade by using a sputter device. Depositing is conducted until a first thickness "t1" of the first metal layer 152 is about equal to or more than 5000 Å. The first metal layer 152 may have a single-layer structure or may have a multiple layer structure.

A photoresist 195 is deposited on the first metal layer 152, and a photo-mask 190 having a transmission portion "TA" and a blocking portion "BA" is disposed over the photoresist 195. Then, light-exposure of the photoresist 195 is conducted. The light-exposed photoresist 195 is developed to form a photoresist pattern. When the photoresist 195 is negative type, portions of the photoresist 195 corresponding to the transmission portion "TA" remain.

Figure 5:
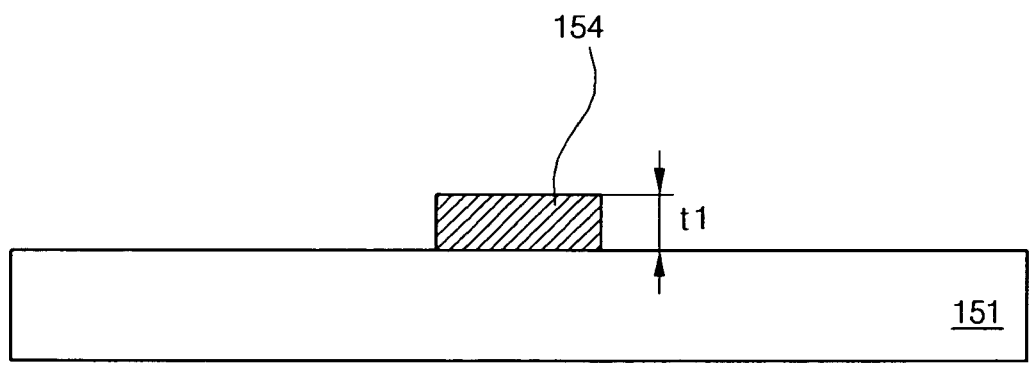

As shown in FIG. 5, a first metal layer 152 (of FIG. 4) is patterned by using the photoresist pattern to form a gate electrode 154 having the first thickness "t1" about equal to or more than 5000 Å.

Figure 6:
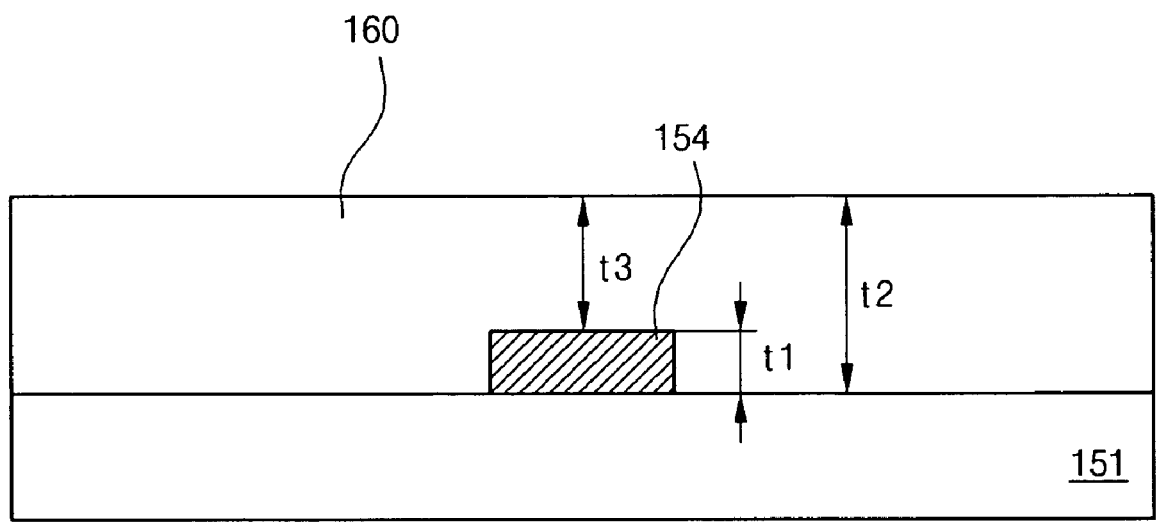

As shown in FIG. 6, a gate insulating layer 160 of an organic insulating material is formed on the flexible substrate 151 and the gate electrode 154. The organic insulating material may be at least one of benzo-cyclo-butene (BCB), photo acrylic and poly vinyl phenol (PVP). The organic insulating material is deposited by using a bar coater, a spin coater or a slit coater. A first portion of the gate insulating layer 160 corresponding to the flexible substrate 151 has a second thickness "t2" about equal to or more than 9000 Å. A second portion of the gate insulating layer 160 corresponding to the gate electrode 154 has a third thickness "t3" of about 2000 Å to 5000 Å. An upper surface of the gate insulating layer 160 is planar.

The second thickness "t2" may be predetermined prior to forming the gate insulating layer 160. In other words, The second thickness "t2" may be predetermined by controlling process factors, for example, a rotation speed, a deposition quantity and so on of the spin coater. Accordingly, when forming the gate electrode 154, the first thickness "t1" may be adequately regulated depending upon the predetermined second thickness "t2" such that the third thickness "t3" can be desirably obtained.

Figure 7:
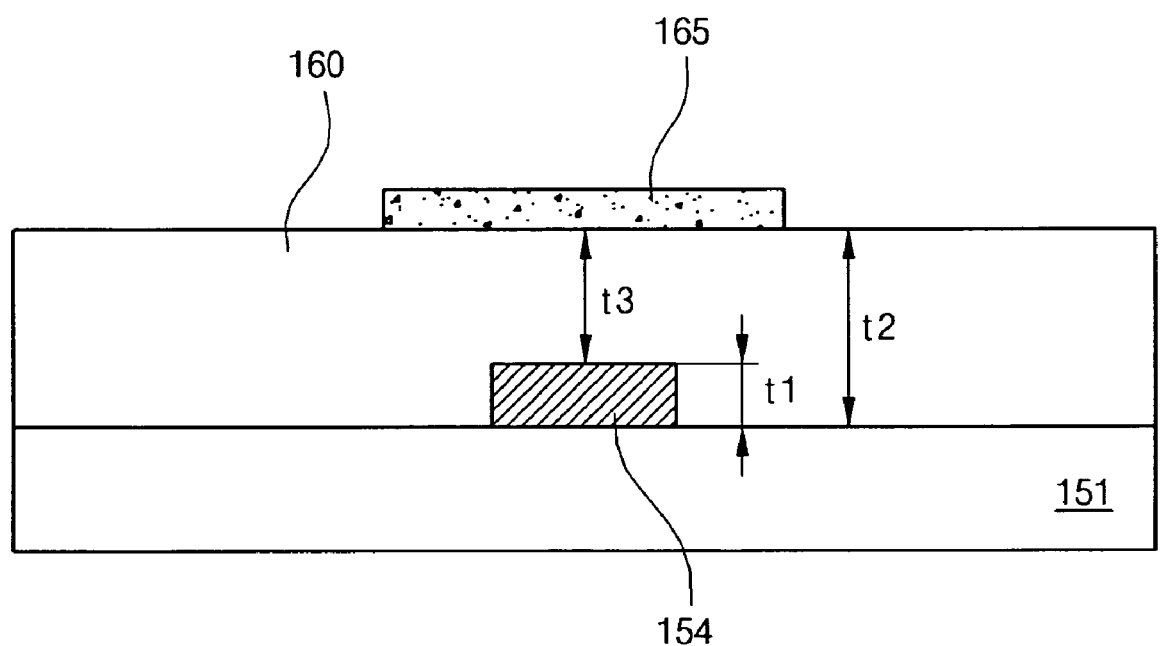

As shown in FIG. 7, a semiconductor layer 165 is formed on the gate insulating layer 160. The semiconductor layer 165 may be made of organic low molecule or high molecule semiconductive material. An upper surface of the semiconductor layer 165 is planar.

A method of forming the semiconductor layer 165 of the organic low molecule semiconductive material is different from a method of forming the semiconductor layer 165 of the organic high molecule semicondutive material. When the organic low molecule semiconductive material is used, the semiconductor layer 165 is formed by an evaporation method using a shadow mask since the organic low molecule semiconductive material is sensitive to moisture. When the organic high molecule semiconductive material is used, the semiconductor layer 165 is formed by depositing the organic high molecule semiconductive material and patterning it with a photo-mask.

Figure 8:
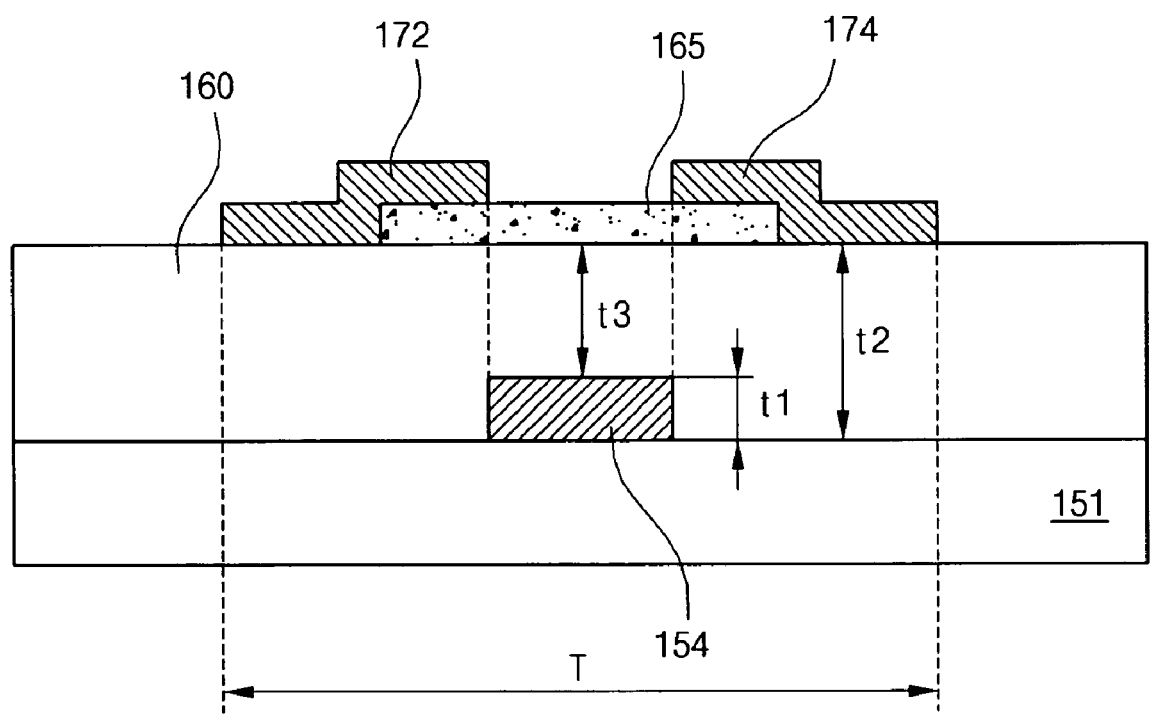

As shown in FIG. 8, a second metal layer is formed on the flexible substrate 151 having the semiconductor layer 165 and patterned by using a photo-mask to form the source and drain electrodes 172 and 174. A distance between the source and drain electrodes 172 and 174 corresponds to the width of the gate electrode 154. The second metal may be at least one of gold (Au), silver (Ag), copper (Cu) and molybdenum (Mo) having a low melting point.

Figure 9:
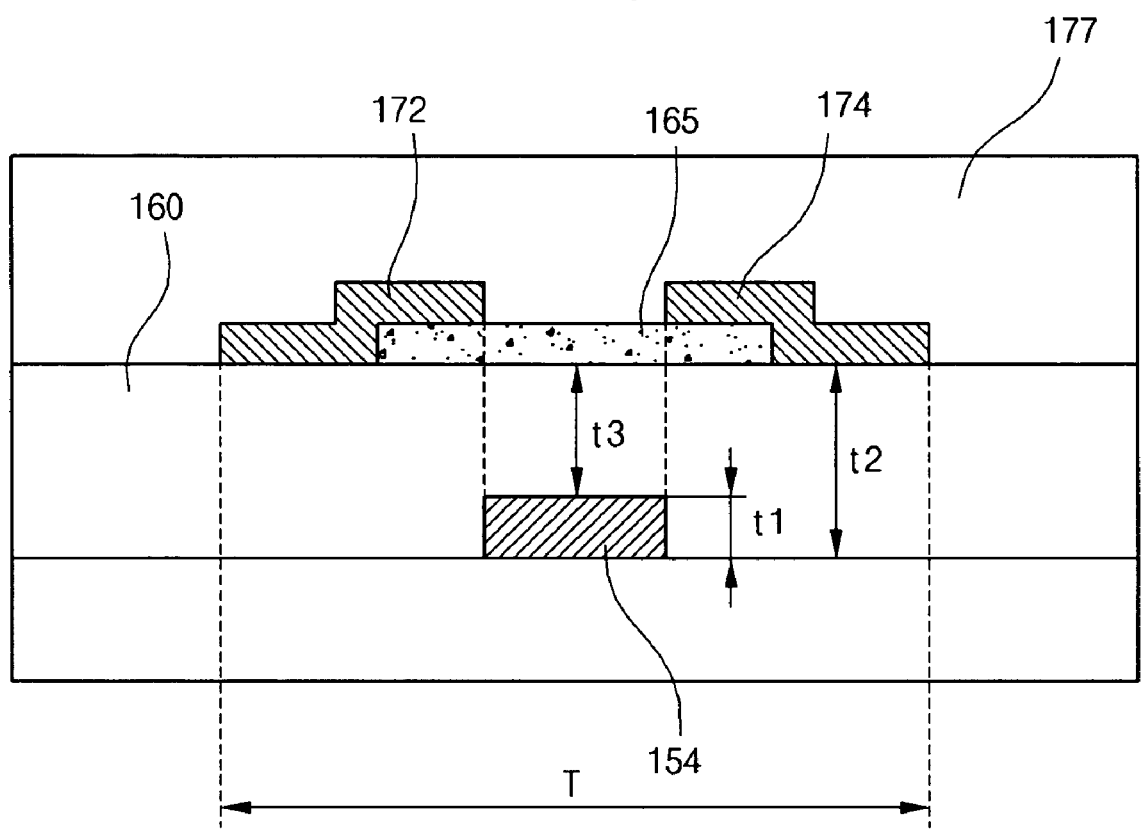

As shown in FIG. 9, a passivation layer 177 is formed on the entire substrate 151 having the source and drain electrodes 172 and 174. The passivation layer 177 may be made of organic insulating material including benzo-cyclo-butene (BCB), photo acrylic and poly vinyl phenol (PVP). An upper surface of the passivation layer 177 is planar.

Figure 10:
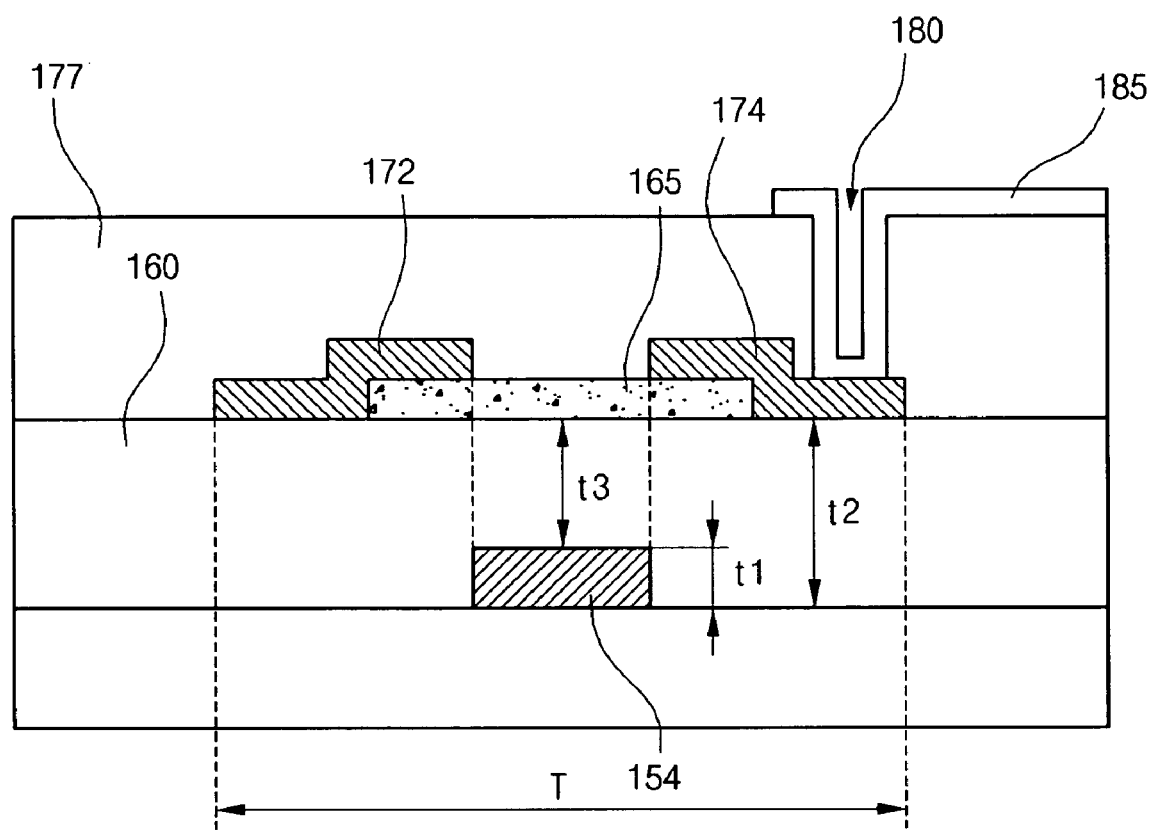

As shown in FIG. 10, the passivation layer 177 is patterned by using a photo-mask to form a contact hole 180 exposing the drain electrode 174. A transparent conductive material layer is formed on the passivation layer 177 and patterned with a photo-mask to form a pixel electrode 185 contacting the drain electrode 174 through the contact hole 180.

Through the above processes, the array substrate including the organic thin film transistor of the first exemplary embodiment can be fabricated. The above processes may be conducted at a temperature equal to or less than 200 degrees centigrade due to using the flexible substrate.

Figure 11:
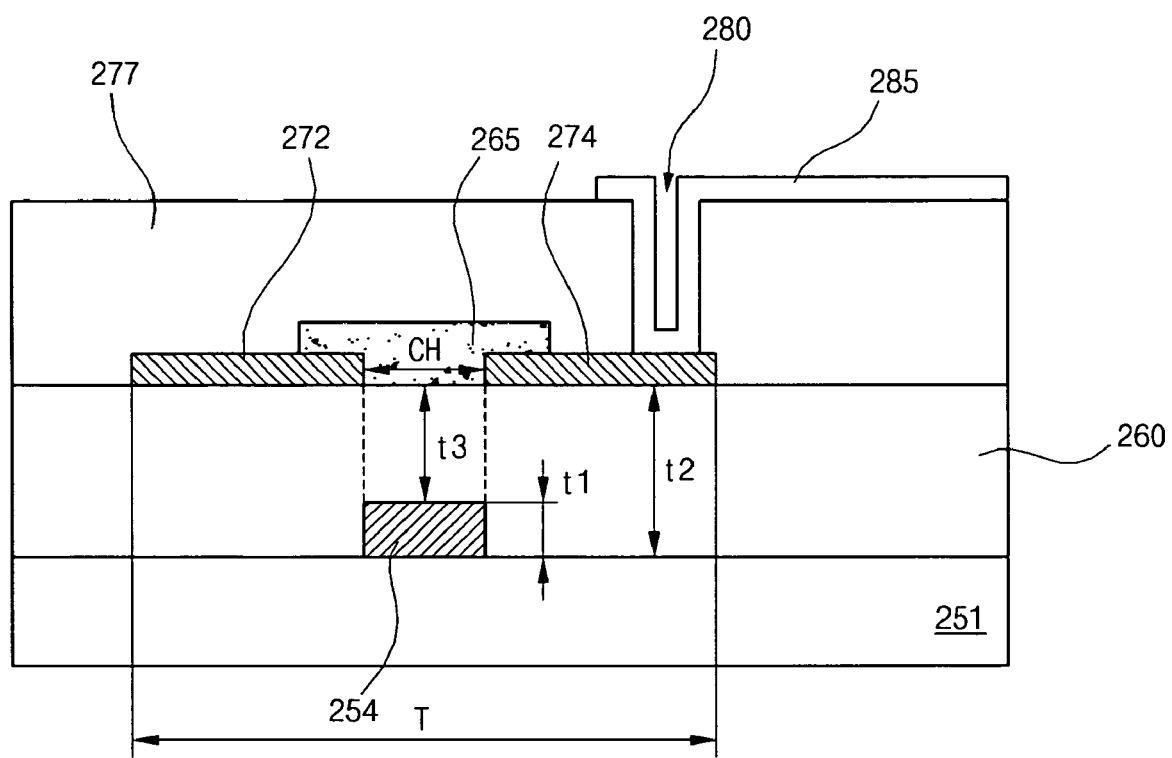
FIG. 11 is a plan view of an array substrate for an LCD device including an organic thin film transistor according to a first exemplary embodiment of the present invention.

FIG. 11 is a plan view of an array substrate for an LCD device including an organic thin film transistor according to a first exemplary embodiment of the present invention. The thin film transistor of the second exemplary embodiment is similar to the thin film transistor of the first exemplary embodiment, except for stacking positions of the semiconductor layer and the source and drain electrodes. Accordingly, detailed explanations of parts similar to parts of the first exemplary embodiment will be omitted.

As shown in FIG. 11, an organic thin film transistor "T" and a pixel electrode 185 are disposed on a flexible substrate 251. The organic thin film transistor "T" includes a gate electrode 254 on the flexible substrate 251, an gate insulating layer 260 on the gate electrode 254 and the flexible substrate 251, source and drain electrodes 272 and 274 on the gate insulating layer 260, and the semiconductor layer 265 on the source and drain electrodes 272 and 274 and the gate insulating layer 260 corresponding to the gate electrode 254. A passivation layer 277 is disposed on the organic thin film transistor "T" and has a contact hole 280 exposing the drain electrode 274. The pixel electrode 285 contacts the drain electrode 274 through the contact hole 280.

With reference to FIGS. 3 and 11, in the organic thin film transistor "T", stacking positions of the semiconductor layer and the source and drain electrodes of the first and second exemplary embodiments are opposite, however, stacking positions of other components of the first and second exemplary embodiments are similar.

An upper surface of the gate insulating layer 260 is planar. The source and drain electrodes 272 and 274 are planar without steps. An upper surface of the semiconductor layer 265 may be planar since it is made of an organic semiconductive material. The source and drain electrodes 272 and 274 overlap and contact both side portions of the semiconductor layer 265. A channel "CH" of the semiconductor layer 265 corresponds to the gate electrode 254 and a space between the source and drain electrodes 272 and 274.

First, second and third thicknesses "t1", "t2" and "t3" are substantially the same as the first, second and third thickness of the first exemplary embodiment. In other words, the gate electrode 254 has a first thickness "t1" about equal to or more than 5000 Å. A first portion of the gate insulating layer 260 on the flexible substrate 251 has a second thickness "t2" about equal to or more than 9000 Å. A second portion of the gate insulating layer 260 on the gate electrode 254 has a third thickness "t3" of about 2000 Å to 5000 Å. Accordingly, electric characteristics of the organic thin film transistor "T" is substantially the same as electric characteristics of the organic thin film transistor of the first exemplary embodiment.

FIGS. 12 to 18 are cross-sectional views showing processes of fabricating an array substrate for an LCD device including an organic thin film transistor according to the second exemplary embodiment of the present invention. A fabrication method of the second exemplary embodiment is similar to a fabrication method of the first exemplary embodiment, except for formation orders of the semiconductor layer and the source and drain electrodes. Accordingly, detailed explanations of parts similar to parts of the first exemplary embodiment will be omitted.

Figure 12:
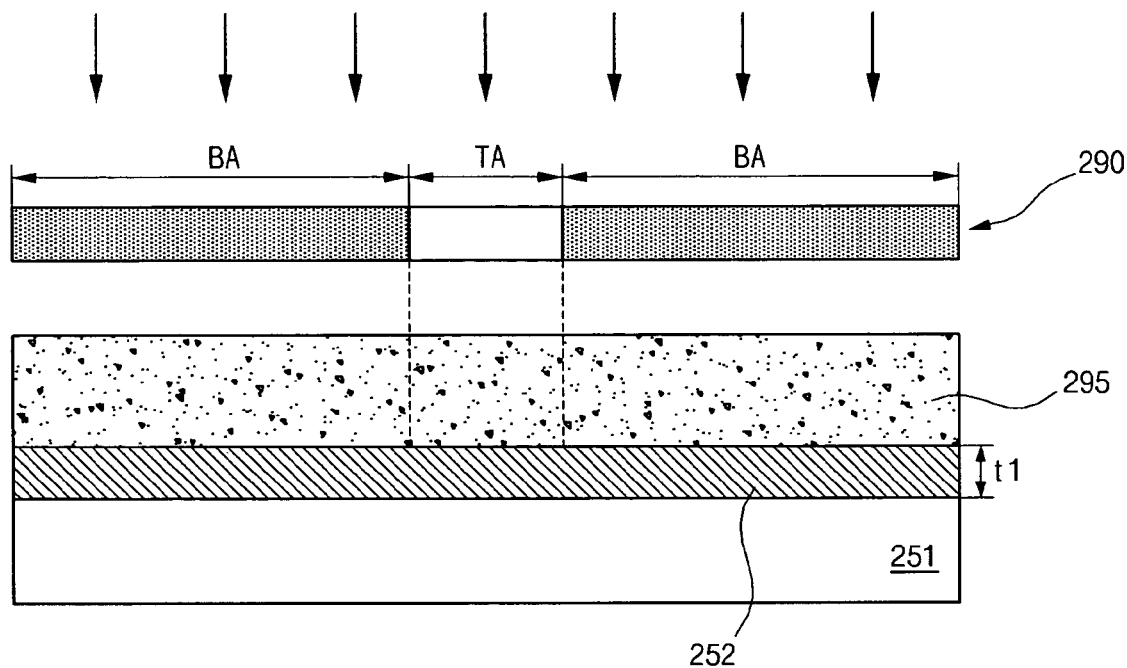
FIGS. 12 to 18 are cross-sectional views showing processes of fabricating an array substrate for an LCD device including an organic thin film transistor according to the second exemplary embodiment of the present invention.

As shown in FIG. 12, a first metal layer 252 is formed on a flexible substrate 251 by using a sputter device. Depositing process is conducted until a first thickness "t1" of the first metal layer 252 is about equal to or more than 5000 Å.

A photoresist 295 is deposited on the first metal layer 252, and a photo-mask 290 having a transmission portion "TA" and a blocking portion "BA" is disposed over the photoresist 295. Then, light-exposure process for the photoresist 295 is conducted. The light-exposed photoresist 295 is developed to form a photoresist pattern.

Figure 13:
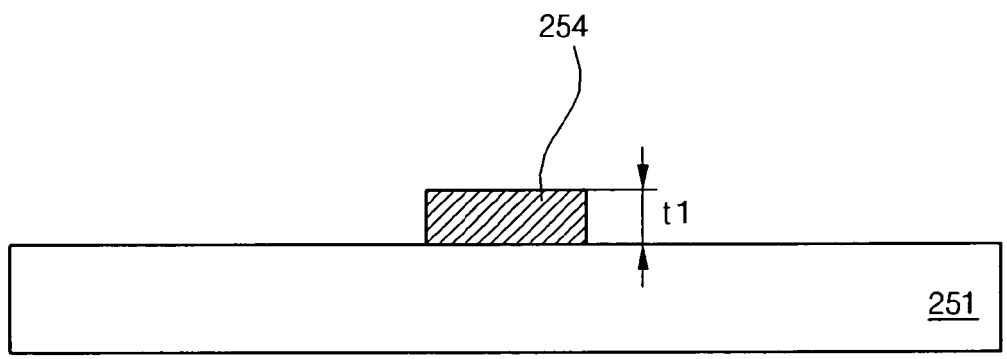

As shown in FIG. 13, a first metal layer 252 (of FIG.12) is patterned by using the photoresist pattern to form a gate electrode.

Figure 14:
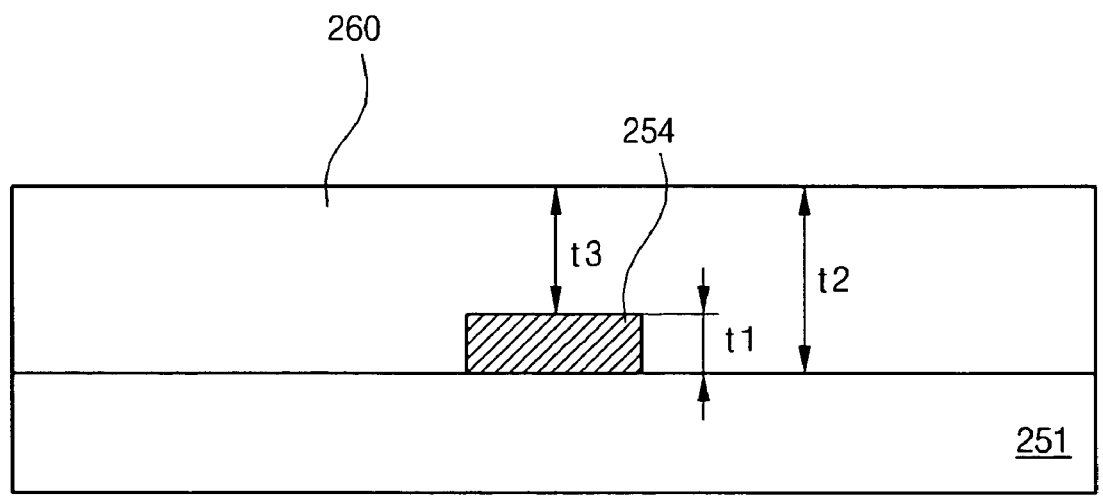

As shown in FIG. 14, a gate insulating layer 260 of an organic insulating material is formed on the flexible substrate 251 and the gate electrode 254 by using a bar coater, a spin coater or a slit coater. A first portion of the gate insulating layer 260 corresponding to the flexible substrate 251 has a second thickness "t2" about equal to or more than 9000 Å. A second portion of the gate insulating layer 260 corresponding to the gate electrode 254 has a third thickness "t3" of about 2000 Å to 5000 Å.

Figure 15:
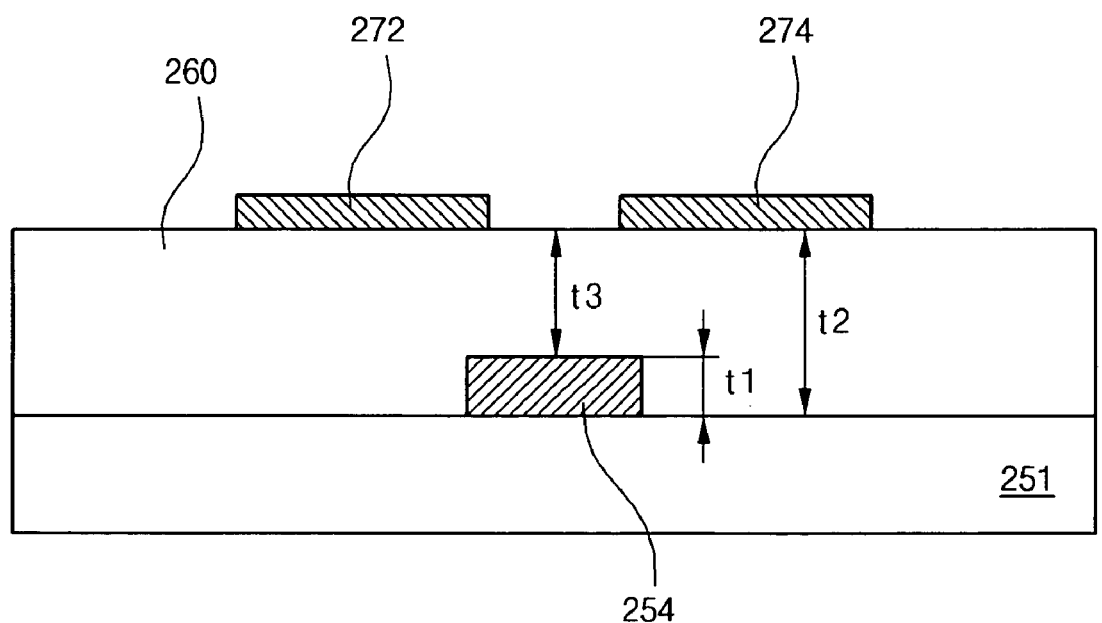

As shown in FIG. 15, a second metal layer is formed on the gate insulating layer 260 and patterned by using a photo-mask to form the source and drain electrodes 272 and 274. A distance between the source and drain electrodes 272 and 274 corresponds to the width of the gate electrode 254.

Figure 16:
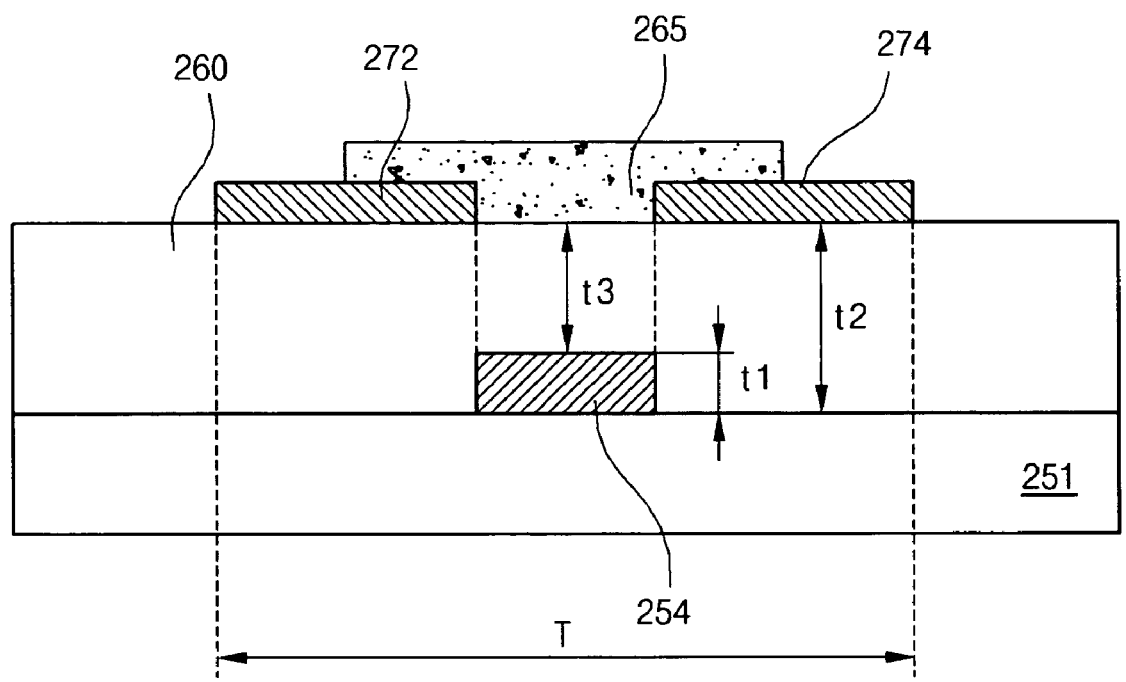

As shown in FIG. 16, a semiconductor layer 265 is formed on the source and drain electrodes 272 and 274 and fills the space between the source and drain electrodes 272 and 274. The semiconductor layer 265 may be made of an organic low molecule or high molecule semiconductive material.

Figure 17:
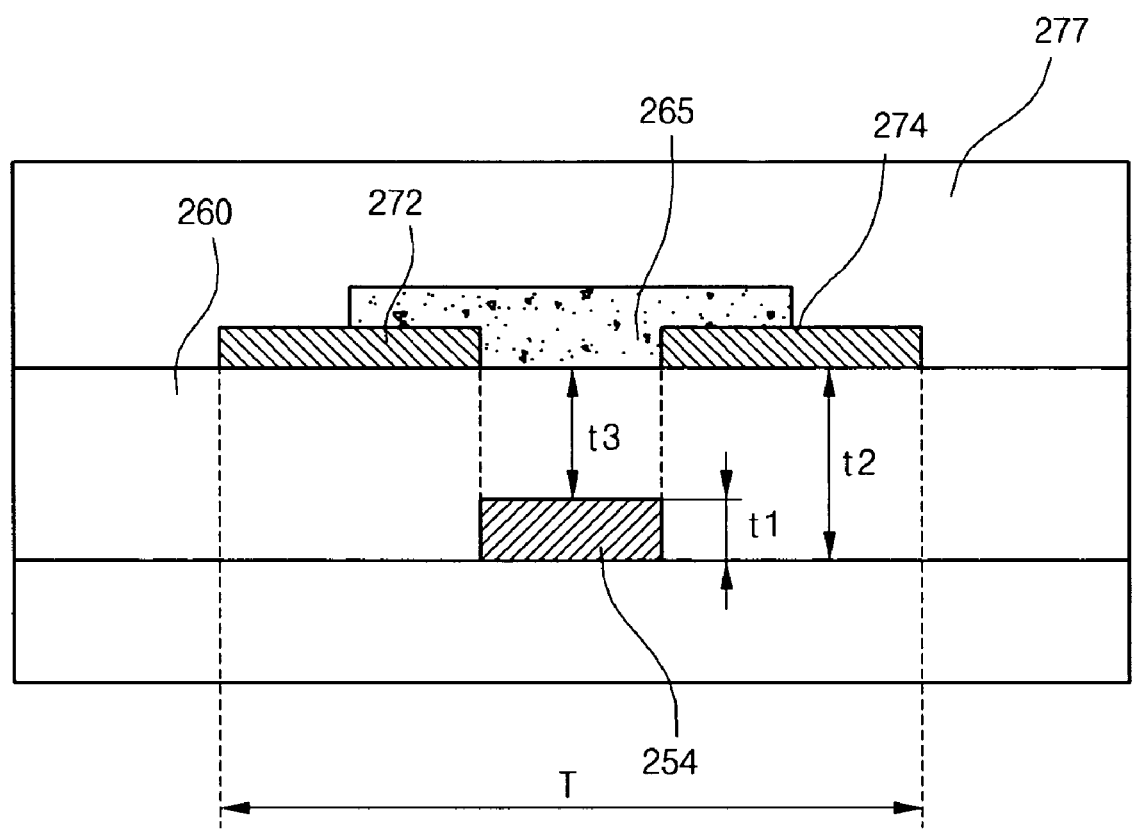

As shown in FIG. 17, a passivation layer 277 is formed on the entire substrate 251 having the semiconductor layer 265.

Figure 18:
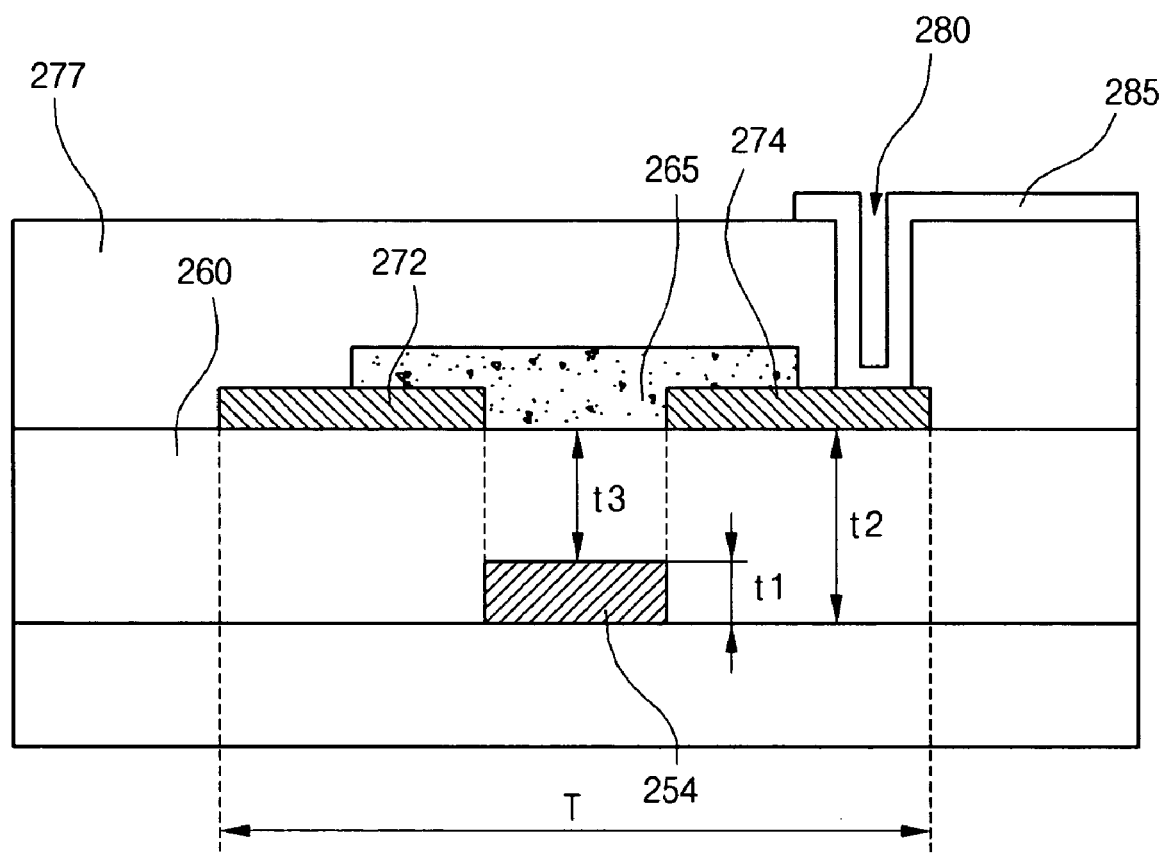

As shown in FIG. 18, the passivation layer 277 is patterned by using a photo-mask to form a contact hole 280 exposing the drain electrode 274. A transparent conductive material layer is formed on the passivation layer 277 and patterned with a photo-mask to form a pixel electrode 285 contacting the drain electrode 274 through the contact hole 280.

Through the above processes, the array substrate including the organic thin film transistor of the first exemplary embodiment can be fabricated.

As explained in the first and second exemplary embodiments of the present invention, the gate electrode has an adequate thickness more than the related art gate electrode, and thus the gate insulating layer corresponding to the gate electrode has an adequate thickness such that the channel capacitance of the organic thin film transistor increases. Therefore, electric characteristics, such as the on-current, of the organic thin film transistor can be improved.

It will be apparent to those skilled in the art that various modifications and variations can be made in the organic thin film transistor and the method of fabricating the organic thin film transistor of the present invention without departing from the spirit or scope of the invention. Thus, it is intended that the present invention cover the modifications and variations of this invention provided they come within the scope of the appended claims and their equivalents.

What is claimed is:

1. An organic thin film transistor, comprising:
    a gate electrode having a first thickness on a substrate, the first thickness being about equal to or more than 5000 Å;
    an organic insulating layer on the gate electrode and the substrate, a portion of the organic insulating layer on the substrate having a second thickness about equal to or more than 9000 Å, and a portion of the organic insulating layer on the gate electrode having a third thickness of about 2000 Å to 5000 Å, a ratio of the first to third thicknesses being greater than about 1;
    a semiconductor layer on the organic insulating layer; and
    source and drain electrodes on the organic insulating layer and contacting both side portions of the semiconductor layer,
    wherein a distance between inner sides of the source and drain electrodes is the same as a width of the gate electrode,
    wherein the organic insulating layer comprises photo acrylic having a dielectric constant of 2.6 to 4.

2. The transistor according to claim 1, wherein the source and drain electrodes are disposed on the semiconductor layer.

3. The transistor according to claim 1, wherein the semiconductor layer is disposed on the source and drain electrodes.

4. The transistor according to claim 1, wherein the organic insulating layer has a planar upper surface.

5. The transistor according to claim 1, wherein the semiconductor layer comprises at least one of an organic low molecule semiconductive material or an organic high molecule semiconductive material.

6. The transistor according to claim 1, wherein the gate electrode comprises at least one of gold (Au), silver (Ag), copper (Cu) or molybdenum (Mo).

7. The transistor according to claim 1, wherein the substrate is a flexible substrate, and the flexible substrate is placed on a rigid substrate to prevent warping of the flexible substrate.

8. A substrate for a liquid crystal display device including an organic thin film transistor, comprising:
    a gate electrode having a first thickness on a substrate, the first thickness being about equal to or more than 5000 Å;
    an organic insulating layer on the gate electrode and the substrate, a portion of the organic insulating layer on the substrate having a second thickness about equal to or more than 9000 Å, and a portion of the organic insulating layer on the gate electrode having a third thickness of about 2000 Å to 5000 Å, a ratio of the first to third thicknesses being greater than about 1;
    a semiconductor layer on the organic insulating layer;
    source and drain electrodes on the organic insulating layer and contacting both side portions of the semiconductor layer;
    a passivation layer on the source and drain electrodes, the passivation layer having a contact hole exposing the drain electrode; and
    a pixel electrode on the passivation layer and contacting the drain electrode through the contact hole,
    wherein a distance between inner sides of the source and drain electrodes is the same as a width of the gate electrode,
    wherein the organic insulating layer comprises photo acrylic having a dielectric constant of 2.6 to 4.

9. The substrate according to claim 8, wherein the semiconductor layer comprises at least one of an organic low molecule semiconductive material or an organic high molecule semiconductive material.

10. The substrate according to claim 8, wherein the gate electrode comprises at least one of gold (Au), silver (Ag), copper (Cu) or molybdenum (Mo).

11. The substrate according to claim 8, wherein the substrate is a flexible substrate, and the flexible substrate is placed on a rigid substrate to prevent warping of the flexible substrate.

12. An organic thin film transistor, comprising:
    a gate electrode having a first thickness on a substrate, the first thickness being about equal to or more than 5000 Å;
    an organic insulating layer on the gate electrode and the substrate, a portion of the organic insulating layer on the substrate having a second thickness about equal to or more than 9000 Å, and a portion of the organic insulating layer on the gate electrode having a third thickness of about 2000 Å to 5000 Å, a ratio of the first to third thicknesses being greater than about 1, the organic insulating layer comprising at least one of benzo-cyclobutene (BCB) or photo acrylic;
    a semiconductor layer on the organic insulating layer; and
    source and drain electrodes on the organic insulating layer and contacting both side portions of the semiconductor layer,
    wherein a distance between inner sides of the source and drain electrodes is the same as a width of the gate electrode,
    wherein the organic insulating layer comprises photo acrylic having a dielectric constant of 2.6 to 4.

13. The transistor according to claim 12, wherein a ratio of the second to third thicknesses is greater than about 1.8.

14. The transistor according to claim 12, wherein the source and drain electrodes are disposed on the semiconductor layer.

15. The transistor according to claim 12, wherein the semiconductor layer is disposed on the source and drain electrodes.

16. The transistor according to claim 12, wherein the substrate is a flexible substrate, and the flexible substrate is placed on a rigid substrate to prevent warping of the flexible substrate.

* * * * *